United States Patent
Yu et al.

(10) Patent No.: US 9,256,709 B2
(45) Date of Patent: Feb. 9, 2016

(54) METHOD FOR INTEGRATED CIRCUIT MASK PATTERNING

(71) Applicant: Taiwan Semiconductor Manufacturing Company, Ltd., Hsin-Chu (TW)

(72) Inventors: Jue-Chin Yu, Taichung (TW); Lun Hsieh, New Taipei (TW); Pi-Tsung Chen, Hsinchu (TW); Shuo-Yen Chou, Hualien (TW); Ru-Gun Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 169 days.

(21) Appl. No.: 14/180,233

(22) Filed: Feb. 13, 2014

(65) Prior Publication Data
US 2015/0227671 A1 Aug. 13, 2015

(51) Int. Cl.
*G06F 17/50* (2006.01)

(52) U.S. Cl.
CPC ........ *G06F 17/5081* (2013.01); *G06F 17/5068* (2013.01)

(58) Field of Classification Search
CPC .......................... G06F 17/5081; G06F 17/5068
See application file for complete search history.

(56) References Cited

U.S. PATENT DOCUMENTS

| | | | | |
|---|---|---|---|---|
| 5,038,384 A * | 8/1991 | Ohoba | ................. | G06K 9/3216 382/194 |
| 5,313,068 A * | 5/1994 | Meiri | ..................... | B82Y 10/00 250/398 |
| 5,515,453 A * | 5/1996 | Hennessey | ........... | G06K 9/4685 382/141 |
| 5,524,064 A * | 6/1996 | Oddou | ...................... | G06T 9/20 375/E7.081 |
| 5,798,195 A * | 8/1998 | Nishi | .................. | G03F 7/70425 430/22 |
| 5,802,204 A * | 9/1998 | Basehore | ............. | G06K 9/6202 382/186 |
| 5,929,940 A * | 7/1999 | Jeannin | ................ | H04N 19/543 348/699 |
| 6,160,916 A * | 12/2000 | Horiuchi | ................. | G06T 9/001 375/E7.081 |
| 6,246,787 B1 * | 6/2001 | Hennessey | ....... | G01N 21/95607 250/559.45 |
| 6,453,458 B1 * | 9/2002 | Fukano | ..................... | G03F 7/24 378/35 |
| 6,625,303 B1 * | 9/2003 | Young | ..................... | G06T 7/004 382/132 |

(Continued)

OTHER PUBLICATIONS

Stefan Hinz, "Fast and Subpixel Precise Blob Detection and Attributions," printed from website http://pdf.aminer.org/000/323/513/fast_and_subpixel_precise_blob_detection_and_attribution.pdf on Feb. 12, 2014, 4 pages, Remote Sensing Technology, Muenchen, Germany.

(Continued)

*Primary Examiner* — Naum B Levin
(74) *Attorney, Agent, or Firm* — Haynes and Boone, LLP

(57) ABSTRACT

Provided is a method of transforming an integrated circuit (IC) pattern into one or more patterns suitable for subsequent processing, such as mask fabrication. The method includes receiving an IC pattern that has an arbitrary shape, and using a computer, deriving an approximation IC pattern, wherein the approximation IC pattern is in a shape that is a user-defined fabrication-friendly shape, such as a rectangle or an ellipse. The method further includes calculating a pattern approximation error between the IC pattern and the approximation IC pattern. The method further includes checking whether the pattern approximation error is less than a user-defined threshold. If it is, the method further includes outputting the approximation IC pattern for subsequent fabrication. Otherwise, the method further includes splitting the IC pattern into a plurality of subparts, and recursively transforming each of the plurality of subparts.

20 Claims, 14 Drawing Sheets

(56) References Cited

U.S. PATENT DOCUMENTS

| | | | | |
|---|---|---|---|---|
| 6,665,846 B2* | 12/2003 | Rein | | G06F 17/5081 716/115 |
| 6,687,411 B1* | 2/2004 | Miura | | H04N 19/176 317/E7.143 |
| 6,807,303 B1* | 10/2004 | Kim | | G06K 9/4647 382/173 |
| 6,947,041 B2* | 9/2005 | Naoi | | G06T 11/40 345/419 |
| 7,031,894 B2* | 4/2006 | Niu | | G01B 11/00 703/6 |
| 7,050,155 B2* | 5/2006 | Case | | G03F 7/70283 355/53 |
| 7,155,698 B1* | 12/2006 | Gennari | | A61B 3/032 716/53 |
| 7,280,696 B2* | 10/2007 | Zakrzewski | | G06K 9/00771 382/218 |
| 7,467,064 B2* | 12/2008 | Vuong | | G01N 21/4788 702/181 |
| 7,487,491 B2* | 2/2009 | Oaki | | G06T 7/001 382/144 |
| 7,721,233 B2* | 5/2010 | Kapur | | G06F 17/5036 716/136 |
| 7,823,118 B2* | 10/2010 | Ji | | G06F 17/5081 257/188 |
| 7,962,884 B2* | 6/2011 | Ishikawa | | G06F 17/5072 716/118 |
| 8,055,103 B2* | 11/2011 | Fu | | G06F 17/30277 382/190 |
| 8,111,901 B2* | 2/2012 | Nikolsky | | G03F 7/70283 382/147 |
| 8,159,644 B2* | 4/2012 | Takatori | | G02F 1/134336 349/146 |
| 8,280,136 B2* | 10/2012 | Gotardo | | G06K 9/6207 378/4 |
| 8,910,089 B1* | 12/2014 | Barai et al. | | G06F 17/5081 716/50 |
| 2002/0010904 A1* | 1/2002 | Ayres | | G03F 1/144 716/136 |
| 2002/0154820 A1* | 10/2002 | Kaneko | | G06T 7/20 382/209 |
| 2004/0252889 A1* | 12/2004 | Liu | | G06K 9/00201 382/190 |
| 2005/0264554 A1* | 12/2005 | Deming | | G06T 11/20 345/418 |
| 2008/0037871 A1* | 2/2008 | Sinop | | G06K 9/34 382/173 |
| 2013/0335555 A1* | 12/2013 | Demandolx | | G06T 7/0083 348/135 |
| 2014/0153828 A1* | 6/2014 | Keszler | | G06T 3/4038 382/173 |
| 2015/0187131 A1* | 7/2015 | Li | | G06T 9/00 345/420 |

OTHER PUBLICATIONS

D. Chaudhuri et al., "A Simple Method for Fitting of Bounding Rectangle to Closed Regions," Elsevier Ltd., Sep. 16, 2005, 9 pages, Pattern Recognition, Uttaranchal, India.

* cited by examiner

METHOD FOR INTEGRATED CIRCUIT MASK PATTERNING

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as IC technologies are continually progressing to smaller technology nodes, such as a 45 nm technology node and below, simply scaling down similar designs used at larger nodes often results in inaccurate or poorly shaped device features. Rounded corners on a device feature that is designed to have right-angle corners may become more pronounced or more critical in the smaller nodes, preventing the device from performing as desired. Other examples of inaccurate or poorly shaped device features include pinching, necking, bridging, dishing, erosion, metal line thickness variations, and other characteristics that affect device performance. Typically, optical proximity correction (OPC) may be performed on a design pattern to help alleviate some of these difficulties before the pattern is created on a mask. One type of OPC techniques includes inserting freeform assist patterns (e.g., a sub-resolution assist feature) into a design layout. It is generally thought that freeform patterns provide maximum degrees of freedom in enhancing lithography performance. However, freeform patterns present difficulties for mask manufacturers.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
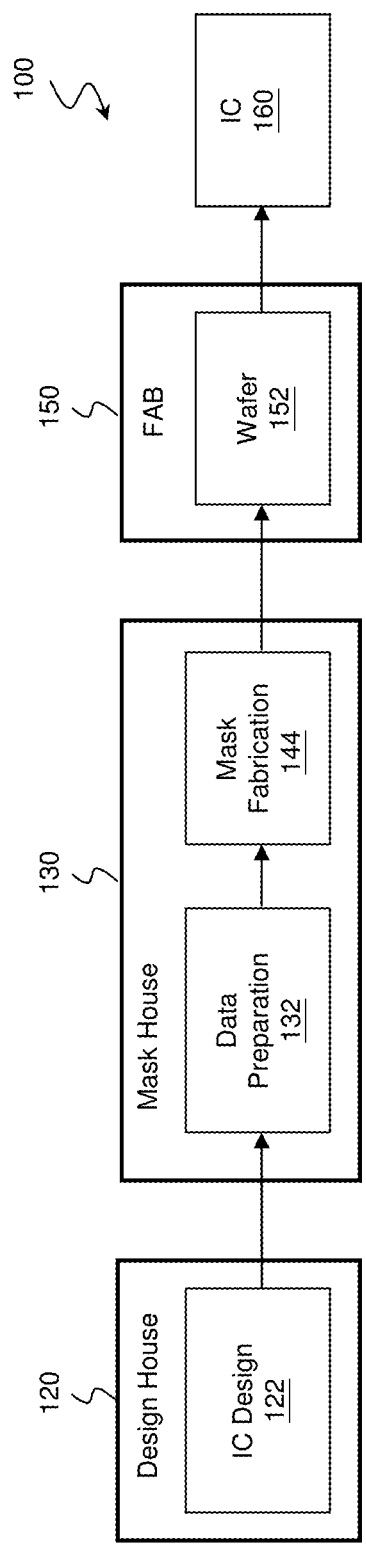
FIG. 1 is a simplified block diagram of an embodiment of an integrated circuit (IC) manufacturing system and an associated IC manufacturing flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a simplified block diagram of an embodiment of an integrated circuit (IC) manufacturing system 100 and an IC manufacturing flow associated therewith, which may benefit from various aspects of the provided subject matter. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may be owned by a single larger company, and may even coexist in a common facility and use common resources.

The design house (or design team) 120 generates an IC design layout 122. The IC design layout 122 includes various geometrical patterns designed for an IC device 160. The geometrical patterns correspond to patterns of metal, oxide, or semiconductor layers that make up the various components of the IC device 160 to be fabricated. The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format or DFII file format.

The mask house 130 uses the IC design layout 122 to manufacture one or more masks to be used for fabricating the various layers of the IC device 160 according to the IC design layout 122. The mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the present embodiment, the mask data preparation 132 and mask fabrication 144 are illustrated as separate elements, however, the mask data preparation 132 and mask fabrication 144 can be collectively referred to as mask data preparation.

The mask data preparation 132 typically includes optical proximity correction (OPC) which uses lithography enhancement techniques to compensate for image errors, such as those that can arise from diffraction, interference, or other process effects. For example, OPC may adjust line widths depending on the density of surrounding geometries; add "dog-bone" endcaps to the end of lines to prevent line end shortening; or correct for electron beam (e-beam) proximity effects. OPC may add assist features, such as scattering bars, serif, and/or hammerheads to the IC design layout 122 according to optical models or rules such that, after a lithography process, a final pattern on a wafer is improved with enhanced resolution and precision. The mask data preparation 132 can include further resolution enhancement techniques (RET), such as off-axis illumination, sub-resolution assist features, phase-shifting masks, other suitable techniques, or combinations thereof. One technique that may be used in conjunction with OPC is inverse lithography technology (ILT), which treats OPC as an inverse imaging problem. In some cases, ILT produces unintuitive mask patterns, such as freeform (or arbitrary-shaped) patterns 202 and 204 shown in FIG. 2.

Figure 2:
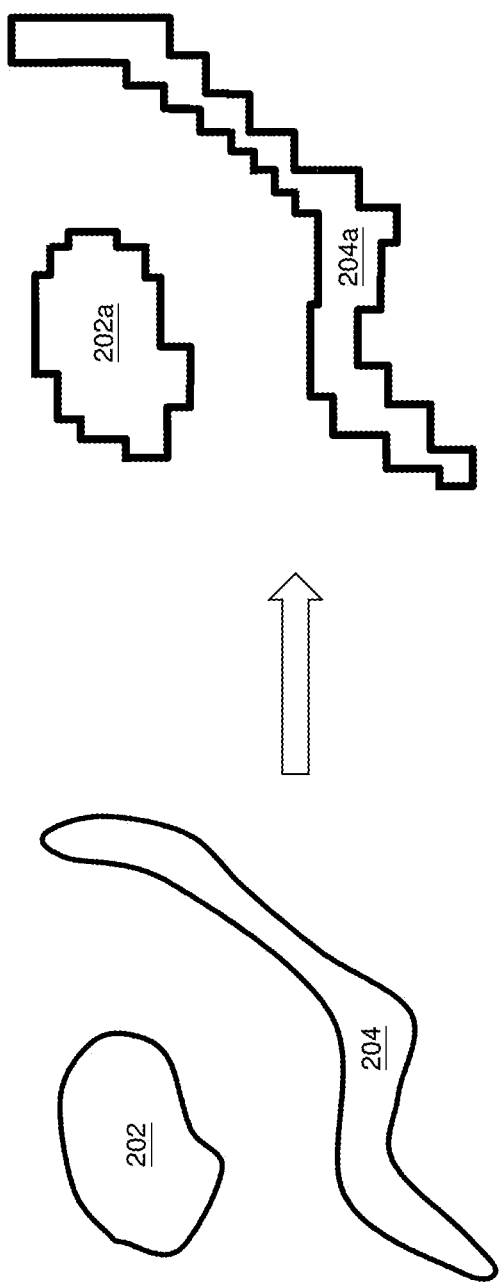
FIG. 2 illustrates IC mask patterns modified according to a prior art method.

The mask data preparation 132 further includes a mask rule checker (MRC) that checks the IC design layout that has undergone processes in OPC with a set of mask creation rules which may contain certain geometric and connectivity restrictions to ensure sufficient margins, to account for variability in semiconductor manufacturing processes, etc. In some cases, MRC modifies the IC design layout to compensate for limitations during mask fabrication 144, which may undo part of the modifications performed by OPC in order to meet mask creation rules. For example, MRC may perform Manhattan conversion to convert a curvy ideal mask from ILT to a zigzag polygon pattern in order to conform to mask creation rules. In one example, Manhattan conversion restricts the output pattern edges to be either horizontal or vertical to accommodate an e-beam mask writer. Consequently, it may produce extensive segments and jogs that suffer from long run time in Mask Fabrication 144. For example, as shown in FIG. 2, the freeform patterns 202 and 204 are converted to polygons 202*a* and 204*a* respectively with extensive jogs and segments that increase e-beam shot counts and mask data volume. Since mask write time (such as measured by e-beam shot count) and mask data volume directly impact semiconductor product development cycle and turnaround time, it is desirable to reduce the number of jogs and segments in a mask pattern by, for example, converting freeform patterns to much simpler geometries than the polygons 202*a* and 204*a*. The provided subject matter, in one or more embodiments, can be used for such purposes. This will be described in more details in a later section of the present disclosure.

The mask data preparation 132 may further include lithography process checking (LPC) that simulates processing that will be implemented by the IC manufacturer 150 to fabricate the IC device 160. LPC simulates this processing based on the IC design layout 122 to create a simulated manufactured device, such as the IC device 160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, or combinations thereof.

After a simulated manufactured device has been created by LPC, if the simulated device is not close enough in shape to satisfy design rules, certain steps in the mask data preparation 132, such as OPC and MRC, may be repeated to refine the IC design layout 122 further.

It should be understood that the above description of the mask data preparation 132 has been simplified for the purposes of clarity, and data preparation may include additional features such as a logic operation (LOP) to modify the IC design layout according to manufacturing rules. Additionally, the processes applied to the IC design layout 122 during data preparation 132 may be executed in a variety of different orders.

After mask data preparation 132 and during mask fabrication 144, a mask or a group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In an embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM.

The IC manufacturer 150, such as a semiconductor foundry, uses the mask (or masks) fabricated by the mask house 130 to fabricate the IC device 160. The IC manufacturer 150 is a IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer is fabricated using the mask (or masks) to form the IC device 160. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, and/or other suitable processes.

Figure 3:
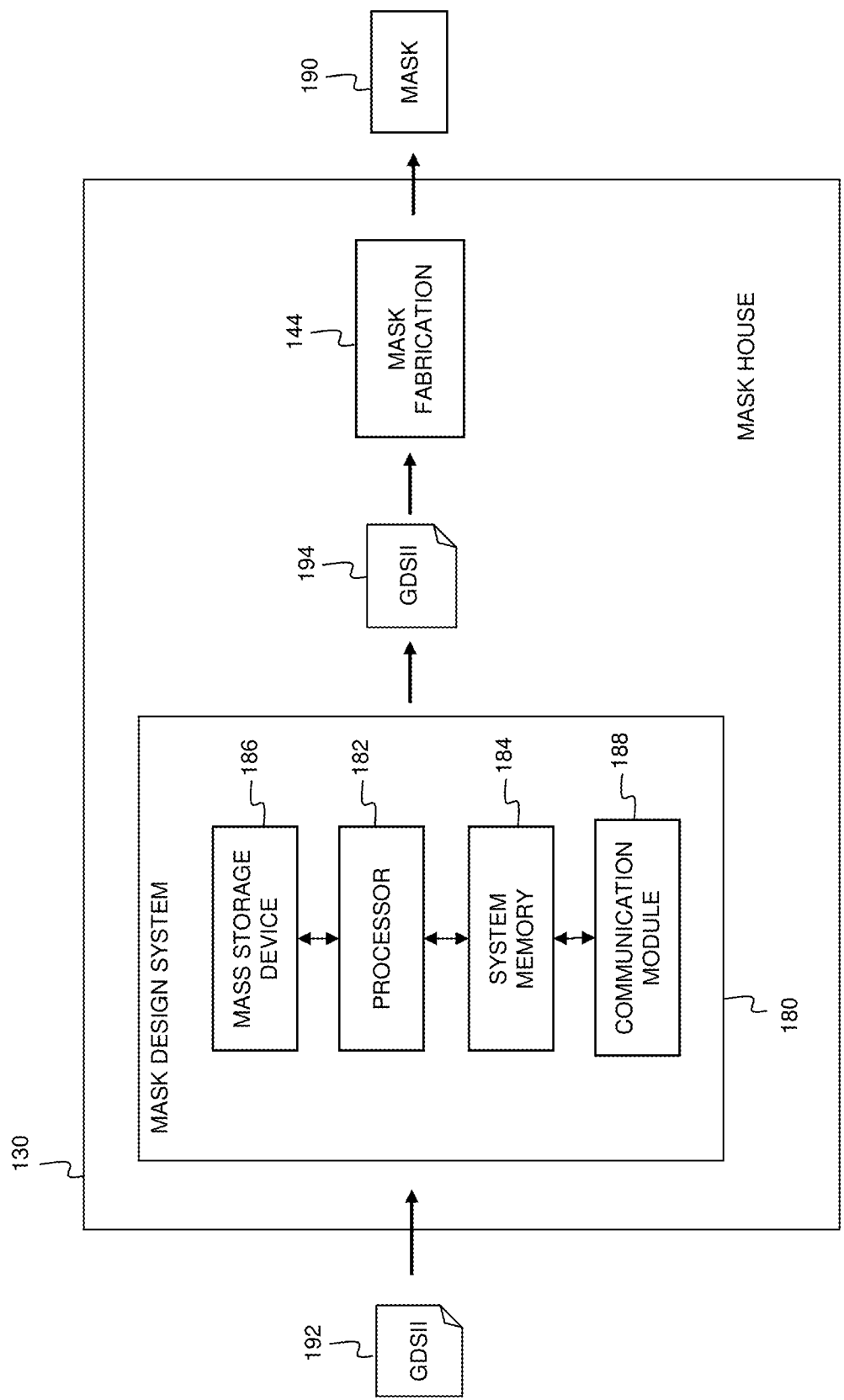
FIG. 3 is a more detailed block diagram of the mask house shown in FIG. 1 according to various aspects of the present disclosure.

FIG. 3 is a more detailed block diagram of the mask house 130 shown in FIG. 1 according to various aspects of the present disclosure. In the illustrated embodiment, the mask house 130 includes a mask design system 180 that is operable to perform the functionality described in association with mask data preparation 132 of FIG. 1. The mask design system 180 is an information handling system such as a computer, server, workstation, or other suitable device. The system 180 includes a processor 182 that is communicatively coupled to a system memory 184, a mass storage device 186, and a communication module 188. The system memory 184 provides the processor 182 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 186. Examples of mass storage devices may include hard discs, optical disks, magneto-optical discs, solid-state storage devices, and/or a variety other mass storage devices known in the art. The communication module 188 is operable to communicate information such as IC design layout files with the other components in the IC manufacturing system 100, such as design house 120. Examples of communication modules may include Ethernet cards, 802.11 WiFi devices, cellular data radios, and/or other suitable devices known in the art.

In operation, the mask design system 180 is configured to manipulate the IC design layout 122 according to a variety of design rules and limitations before it is transferred to a mask 190 by mask fabrication 144. For example, in an embodiment, mask data preparation 132, including OPC, MRC, and LPC, may be implemented as software instructions executing on the mask design system 180. In such an embodiment, the mask design system 180 receives a first GDSII file 192 containing the IC design layout 122 from the design house 120. After the mask data preparation 132 is complete, the mask design system 180 transmits a second GDSII file 194 containing a modified IC design layout to mask fabrication 144. In alternative embodiments, the IC design layout may be transmitted between the components in IC manufacturing system 100 in alternate file formats such as DFII, CIF, OASIS, or any other suitable file type. Further, the mask design system 180 and the mask house 130 may include additional and/or different components in alternative embodiments.

Figure 4A:
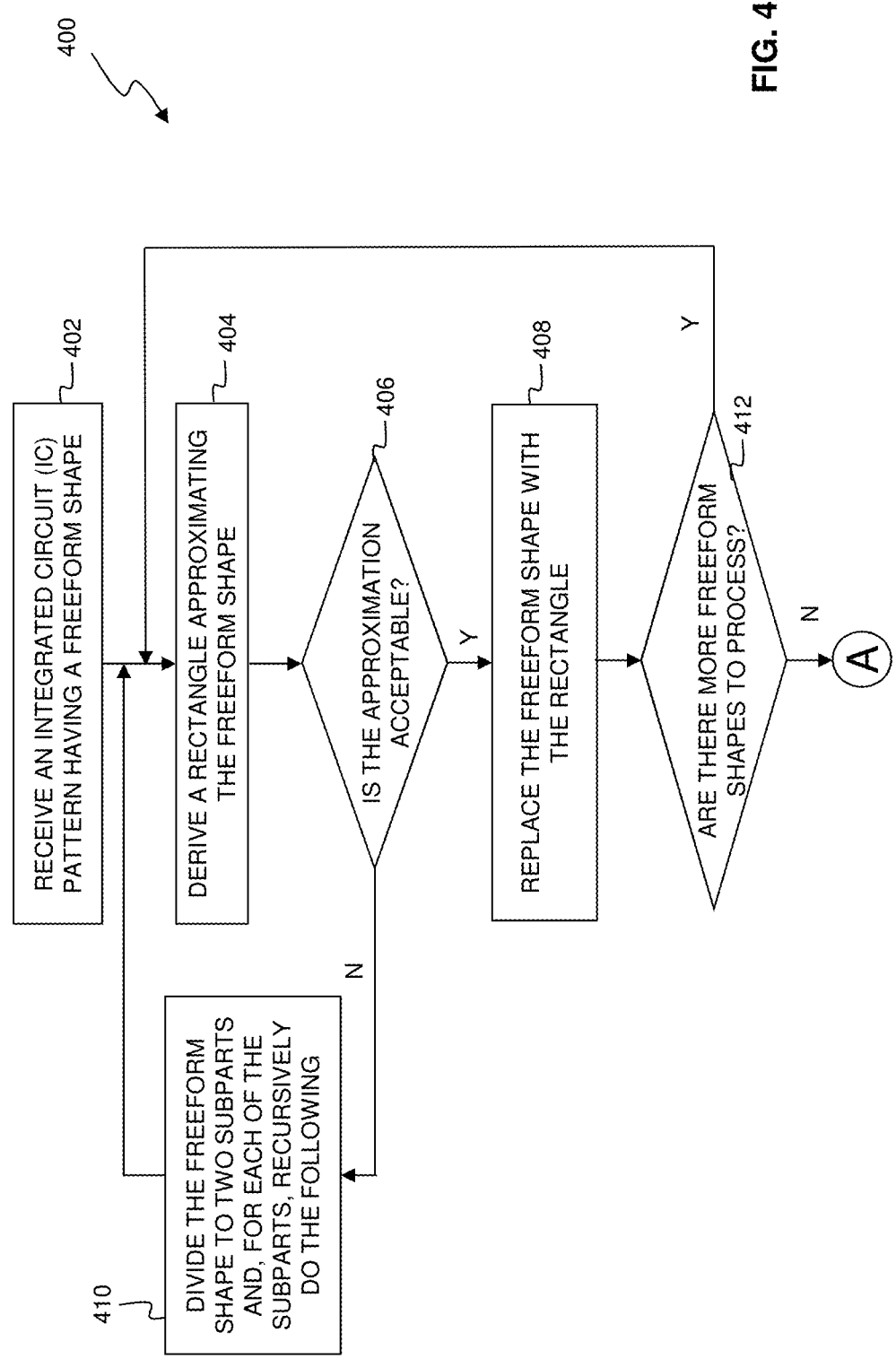
FIGS. 4A and 4B show a high-level flowchart of a method of modifying an IC design layout according to various aspects of the present disclosure.
Figure 4B:
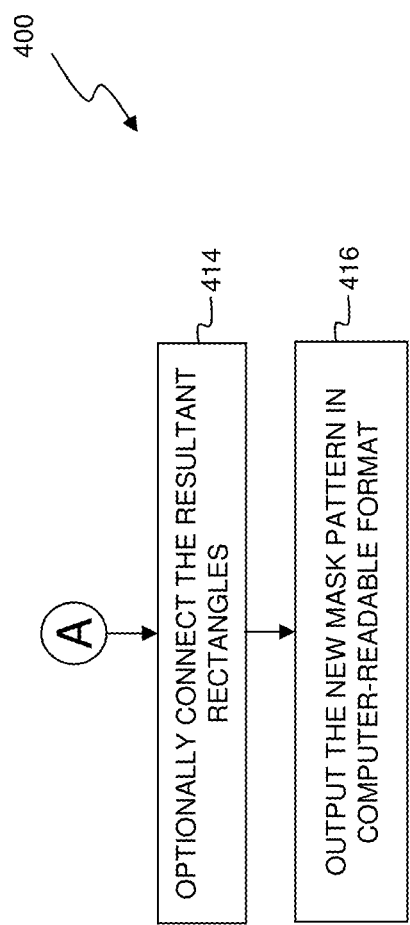

FIGS. 4A and 4B are a high-level flowchart of a method 400 of modifying an IC design layout before mask fabrication according to various aspects of the present disclosure. In an embodiment, the method 400 may be implemented in the mask data preparation 132 of mask house 130 shown in FIG. 1. Although the present embodiment describes the method 400 as creating a mask pattern from an IC pattern, it can also be viewed as creating another mask pattern from an existing mask pattern by transforming or modifying the existing mask pattern. Furthermore, the method 400 can also be used in a maskless fabrication wherein an IC design layout is converted to, through a process including the method 400, a format accessible by a maskless fabrication tool, such as an e-beam direct writer. Additional operations can be provided before, during, and after the method 400, and some operations described can be replaced, eliminated, or moved around for additional embodiments of the method. The method 400 in FIGS. 4A and 4B is a high-level overview and details associated with each operation therein will be described in association with the subsequent figures in the present disclosure.

The method 400 (FIG. 4A) begins at operation 402 where the mask house 130 receives the IC design layout 122. The IC design layout 122 includes various geometrical patterns representing features of an integrated circuit. For example, the IC design layout 122 may include main IC features such as active regions, gate electrodes, sources and drains, metal lines, interlayer interconnection vias, and openings for bonding pads that may be formed in a semiconductor substrate (such as a silicon wafer) and various material layers disposed over the semiconductor substrate. The IC design layout 122 may also include certain assist features, such as those features for imaging effect, processing enhancement, and/or mask identification information.

Figure 5:
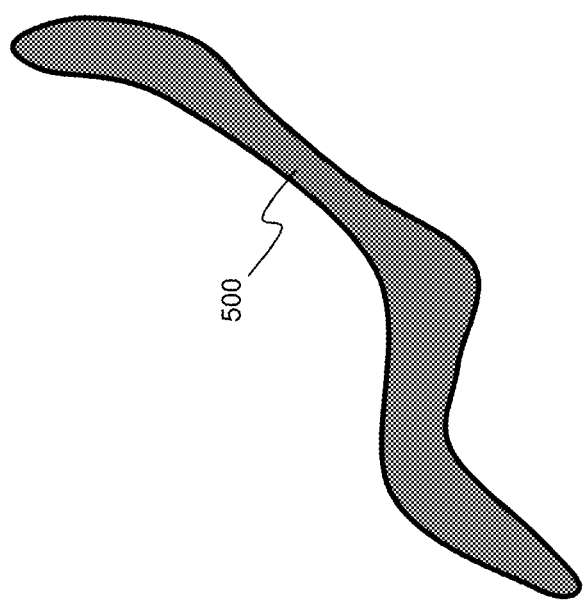
FIGS. 5, 7A-7D, 8-10 illustrate an IC feature mask pattern modified according to the method shown in FIGS. 4A and 4B, in accordance with an embodiment.

In this regard, FIG. 5 illustrates an example IC pattern 500 that is a pattern contained in the IC design layout 122. Referring to FIG. 5, the IC pattern 500 has a freeform irregular shape. Such a shape presents difficulties for subsequent processing, such as mask fabrication 144, and therefore a conversion to one or more fabrication-friendly shapes (or geometrical patterns) is in order. In an embodiment, the IC pattern 500 is produced by ILT.

Figure 6:
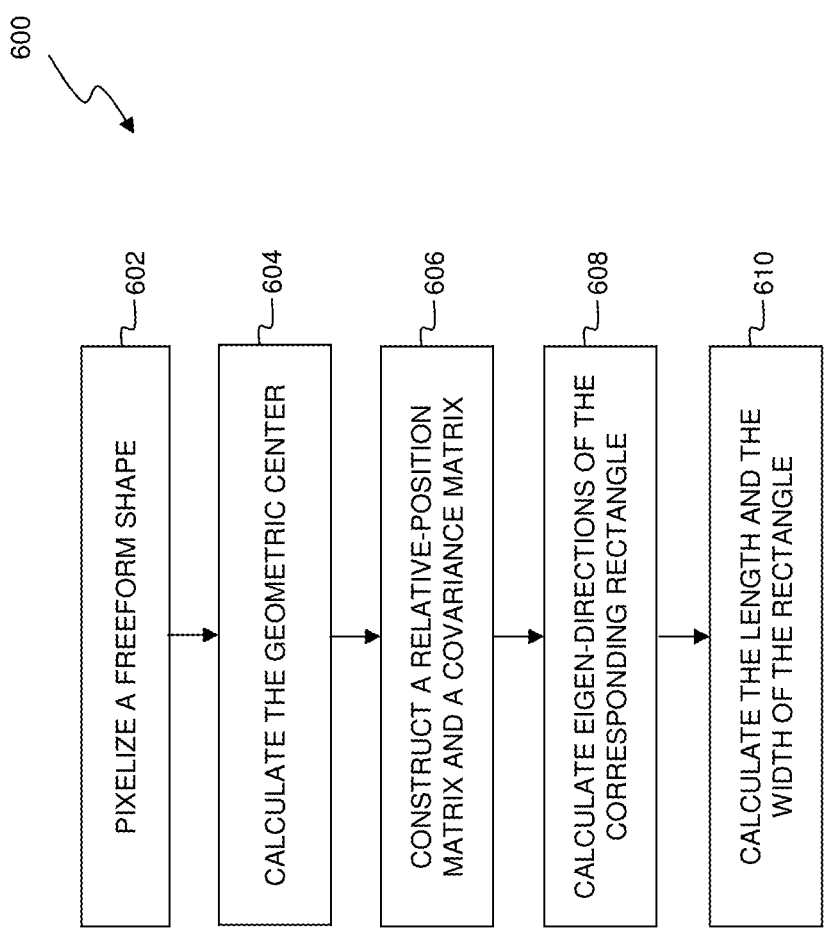
FIG. 6 illustrates a flowchart of a method of approximating a freeform pattern with a rectangle according to various aspects of the present disclosure.

The method 400 proceeds to operation 404 to derive a fabrication-friendly shape approximating the IC pattern 500. In an embodiment, one of a plurality of user-defined fabrication-friendly shapes, such as a rectangle or an ellipse, is chosen, and then a position and size of the shape are subsequently determined in order to replace the IC pattern 500 in the IC design layout 122, or alternatively to be used in another design layout transformed from the IC design layout 122. In the present embodiment, a rectangle approximating the IC pattern 500 is derived by operation 404 using a method such as a method 600 shown in FIG. 6. FIG. 6 will be described below in conjunction with FIGS. 7A-7D.

Figure 7A:
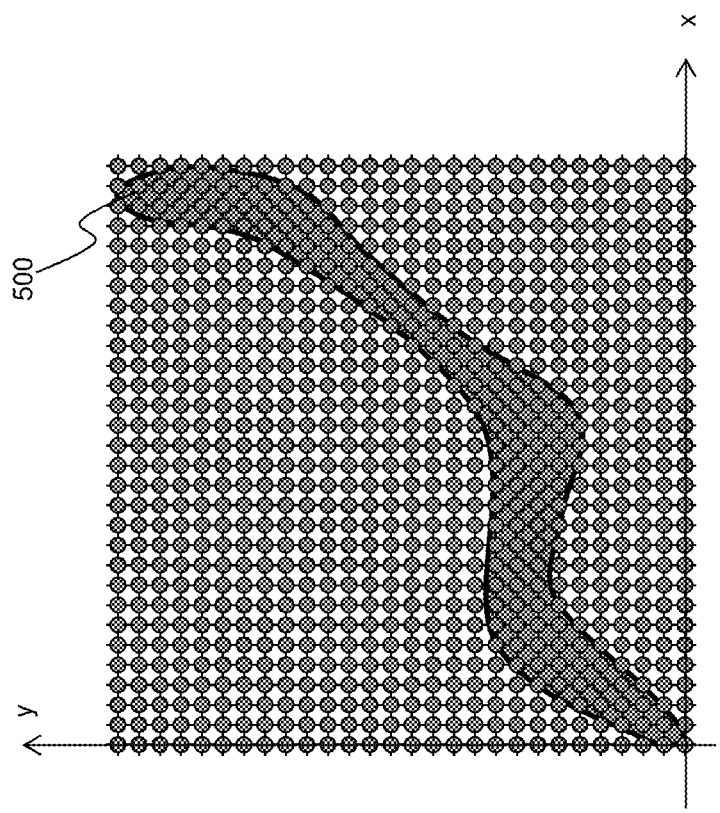
Figure 7B:
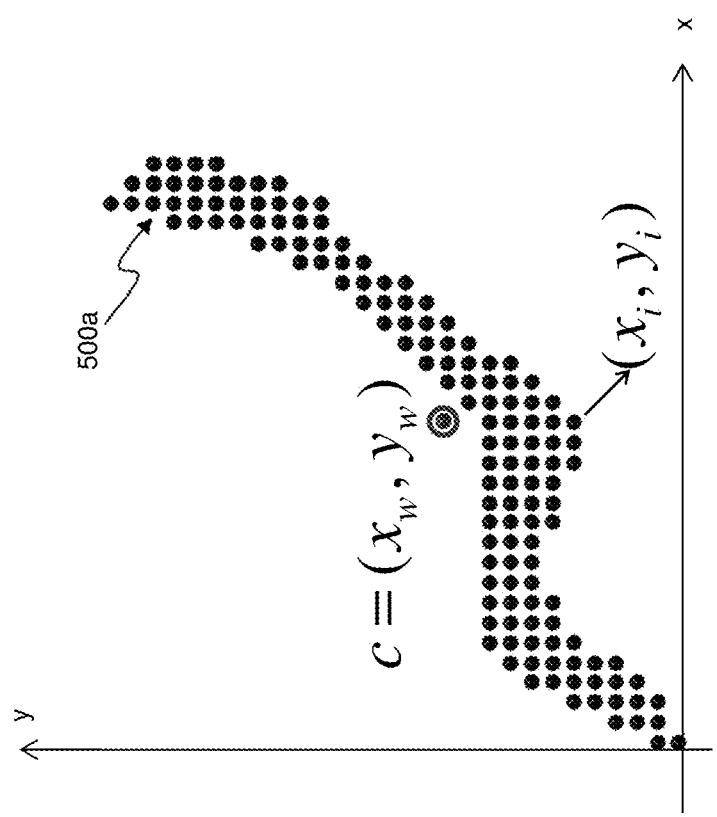

Referring to FIG. 6, the method 600 pixelizes the IC pattern 500 in operation 602, i.e., converts the IC pattern 500 to a collection of pixels or points having coordinates (x, y) in a two dimensional Cartesian coordinate system. This is illustrated in FIGS. 7A and 7B. With reference to FIG. 7A, the resolution of the bitmap (step sizes in both x and y directions) is based on a specification of a pattern transformation accuracy. With reference to FIG. 7B, the collection of pixels representing the IC pattern 500 is referred to as pattern 500a. For the sake of simplicity in the following discussion, assume there are N pixels comprising the pattern 500a and each of the N pixels is represented as $(x_i, y_i)$, where $i \in [1, N]$. Furthermore, FIG. 7B shows that the pixels of the pattern 500a are all located in the first quadrant of the two dimensional Cartesian coordinate system. However, this needs not always be the case and the position of the pattern 500a in the Cartesian coordinate system does not limit the inventive scope of the present disclosure.

The method 600 (FIG. 6) proceeds to operation 604 to calculate a geometric center, C, of the pattern 500a (FIG. 7B), where $C = (x_w, y_w)$, and:

$$x_w = \frac{1}{N} \sum_{1}^{N} x_i \quad (1)$$

$$y_w = \frac{1}{N}\sum_1^N y_i \quad (2)$$

The method 600 (FIG. 6) proceeds to operation 606 to construct a relative position matrix, M, and a covariance matrix, A, wherein M is a N by 2 (N×2) array of real numbers:

$$M = \begin{bmatrix} x_1 - x_w, y_1 - y_w \\ \vdots \\ x_i - x_w, y_i - y_w \\ \vdots \\ x_N - x_w, y_N - y_w \end{bmatrix} \in R^{N \times 2} \quad (3)$$

$$A = M^T M \quad (4)$$

The method 600 (FIG. 6) proceeds to operation 608 to calculate two eigenvectors $u=[u_1, u_2]^T$ and $v=[v_1, v_2]^T$ of an approximation rectangle and two eigenvalues $\lambda_1$ and $\lambda_2$ by solving the following:

$$A = M^T M \quad (5)$$
$$= \begin{bmatrix} u_1 & v_1 \\ u_2 & v_2 \end{bmatrix} \begin{bmatrix} \lambda_1 & 0 \\ 0 & \lambda_2 \end{bmatrix} \begin{bmatrix} u_1 & v_1 \\ u_2 & v_2 \end{bmatrix}^{-1}$$
$$= [u \ v] \begin{bmatrix} \lambda_1 & 0 \\ 0 & \lambda_2 \end{bmatrix} [u \ v]^{-1}$$

Figure 7C:
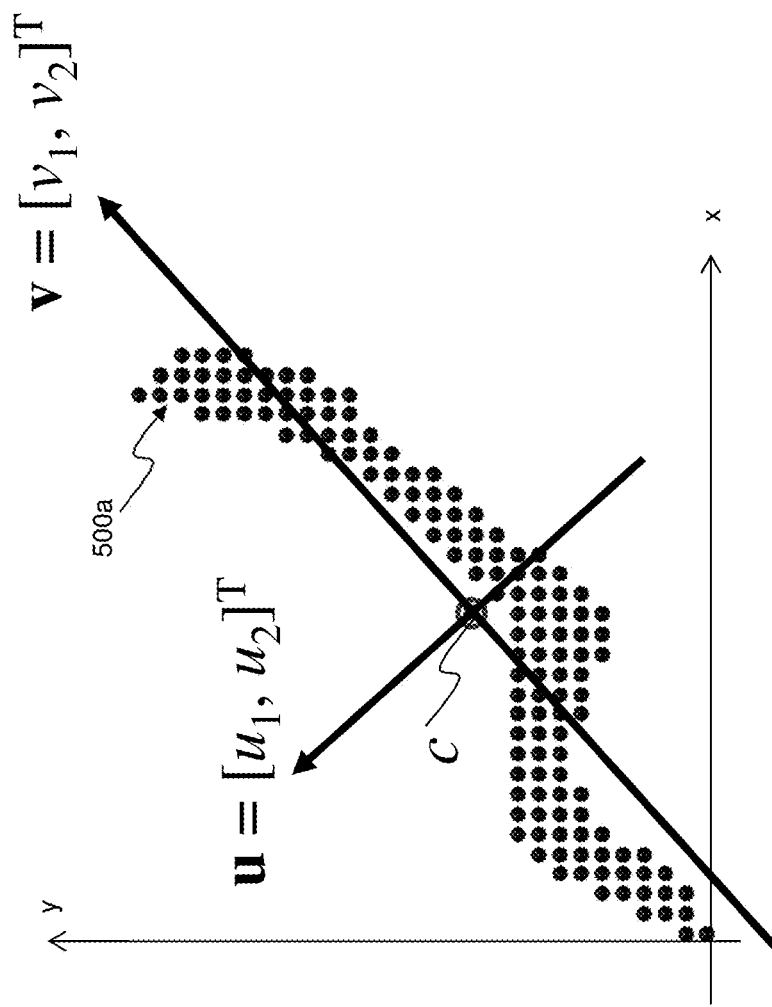

This is illustrated in FIG. 7C. In the present embodiment, the two eigenvectors, u and v, cross at the geometric center C.

The method 600 (FIG. 6) proceeds to operation 610 to calculate a length, L, and a width, W, of the approximation rectangle, where a is an area of the IC pattern 500:

$$L = \sqrt{\left|\frac{a\lambda_1}{\lambda_2}\right|} \quad (6)$$

$$W = \sqrt{\left|\frac{a\lambda_2}{\lambda_1}\right|} \quad (7)$$

Figure 7D:
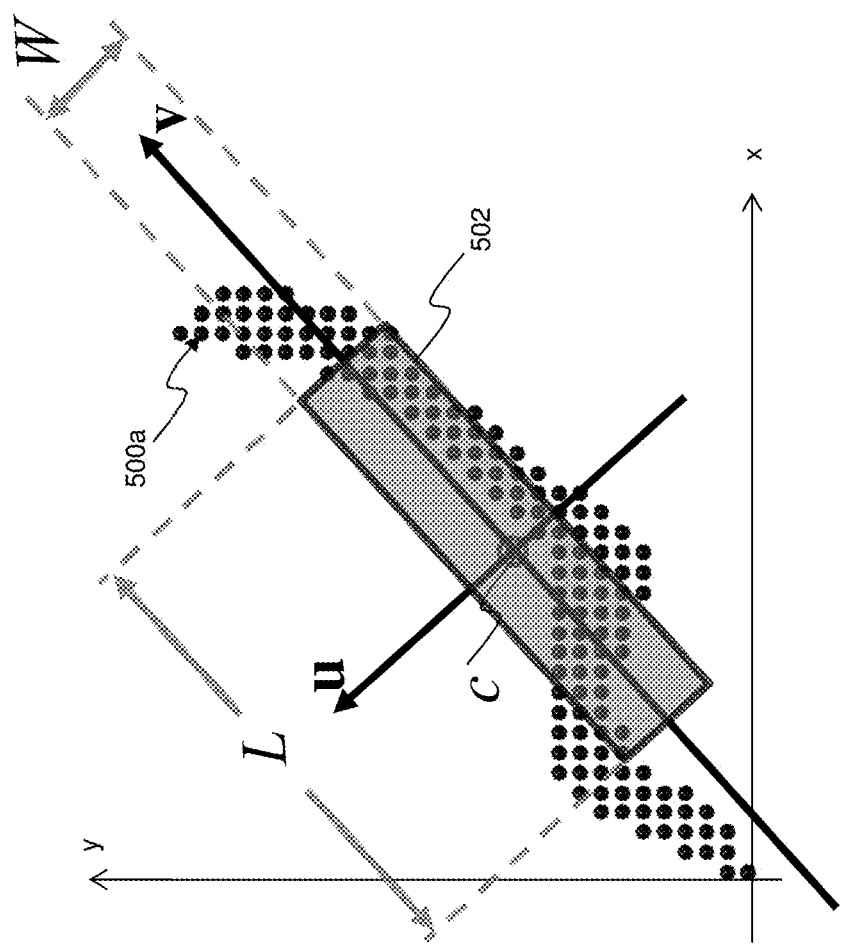

In an embodiment, the method 600 places the approximation rectangle with its geometric center being also at $C=(x_w, y_w)$. This is illustrated in FIG. 7D. The approximation rectangle 502 is derived by operation 404 (FIG. 4A) using the method 600 (FIG. 6).

In another embodiment, operation 404 limits the orientation of the approximation rectangle to be one of a few discrete directions for simplifying the computation. For example, operation 404 may limit the longer side of an approximation rectangle to be oriented in one of four directions: horizontal (parallel to the "x" axis in FIG. 7D), vertical (parallel to the "y" axis in FIG. 7D), 45 degree diagonal (forming a 45 degree angle with the "x" axis in the first and third quadrants), and 135 degree diagonal (forming a 45 degree angle with the "x" axis in the second and fourth quadrants). Alternatively, operation 404 may limit the longer side of an approximation rectangle to be oriented in one of two directions: horizontal and vertical.

Referring back to FIG. 4A, the method 400 proceeds to operation 406 to check whether the approximation derived by operation 404 satisfies certain criteria, thus acceptable. In an embodiment, a normalized pattern error is used as one of the criteria. For example, a normalized pattern error can be calculated as a ratio between the number of pixels that are on either the pattern 500a or the rectangle 502 but not both of them and the total number of pixels that are on the pattern 500a. If the normalized pattern error is less than a user-defined threshold, the approximation derived by operation 404 is accepted and the method 400 proceeds to operation 408. Otherwise, the method 400 proceeds to operation 410. In another embodiment, the geometric center, C, is used as one of the pattern approximation criteria. For example, if C is outside of the pattern 500a (FIG. 7B), the approximation derived by operation 404 is deemed not acceptable. In such a case, much of the calculations of the method 600 can be skipped to save processing time.

At operation 408, the approximation derived by operation 404 (e.g., the rectangle 502) is accepted and output into a computer readable format for subsequent processing. In an embodiment, the four vertices of the rectangle 502 are output into a file or stored in a memory, which can be used for reconstructing the rectangle 502 later.

Figure 8:
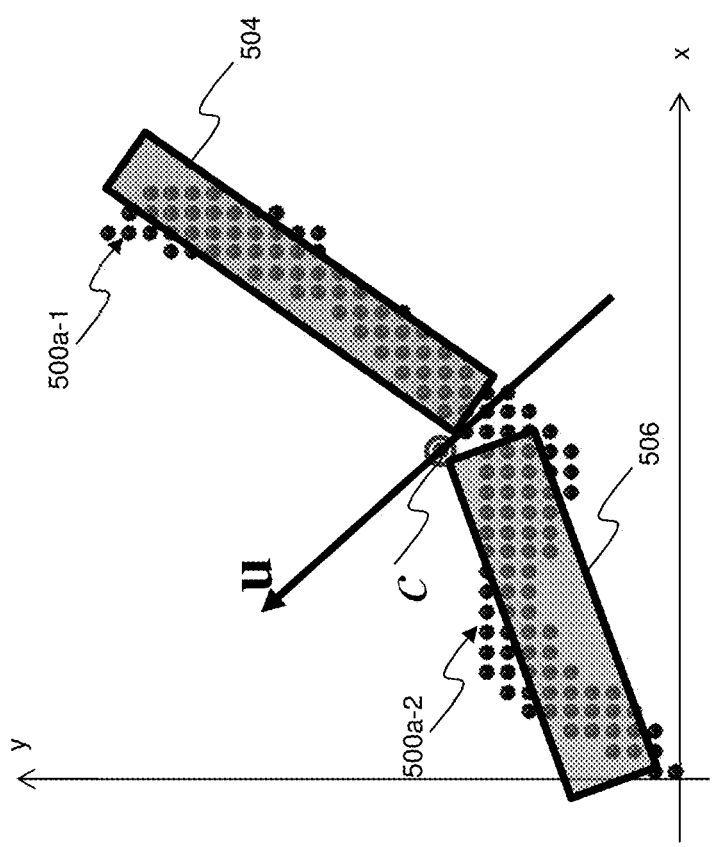

At operation 410, since the approximation derived in operation 404 is not acceptable, the method 400 divides the freeform IC pattern 500 into a plurality of subparts and proceeds to operation 404 to recursively approximate each of the subparts. In an embodiment, as illustrated in FIG. 8, operation 410 divides the IC pattern 500a into two subparts, 500a-1 and 500a-2, along the eigenvector u and through the geometric center C. Alternatively, operation 410 may divide the IC pattern 500a along another line. The subparts 500a-1 and 500a-2 are each smaller than the IC pattern 500a for the purpose of convergence. In another embodiment, operation 410 divides the IC pattern 500a into more than two subparts for increased parallel processing.

For each of the subparts 500a-1 and 500a-2 (FIG. 8), the method 400 repeats operations 404 and 406 recursively until an acceptable approximation pattern has been derived for each subpart (or sub-subpart, as the case may be). For the purpose of illustration, FIG. 8 further shows that rectangles 504 and 506 are derived in operation 404 for approximating the subparts 500a-1 and 500a-2 respectively; and FIG. 9 shows that the rectangle 504 is accepted in operation 406 for further processing, but the rectangle 506 is rejected in operation 406 and the subpart 500a-2 is further divided and two rectangles, 508 and 510, are derived in a subsequent iteration.

At operation 412, the method 400 checks to see if the original IC pattern 500 or any subpart thereof has been approximated with an acceptable fabrication-friendly shape, a rectangle in the present embodiment. If it has not, the method 400 proceeds to operation 404 to process such pattern or subpart. Otherwise, it proceeds to operation 414 (FIG. 4B).

Figure 9:
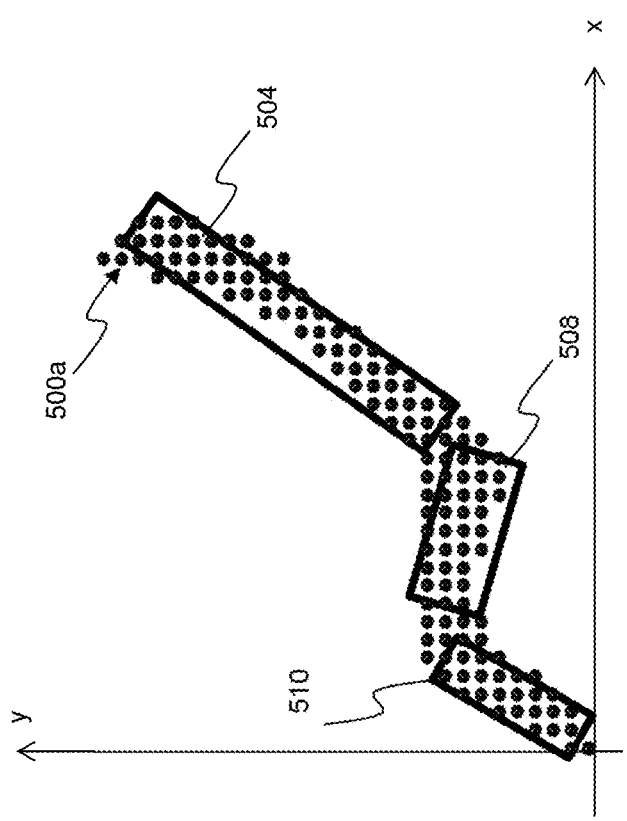

If operation 410 has split a pattern into two or more subparts, then two or more approximation rectangles will have been produced by operations 404 and 406, such as the rectangles 504, 508, and 510 (FIG. 9). At operation 414, the method 400 connects the two or more approximation rectangles 504, 508, and 510 so that the connected rectangles collectively approximate the IC pattern 500. In an embodiment, operation 414 partially overlaps or merges the approximation rectangles 504, 508, and 510 one with another to form a connected polygon.

The method 400 proceeds to operation 416 to output, in a computer-readable format, the approximation pattern(s), such as one rectangle, a plurality of rectangles, or a connected series of rectangles. These patterns are used in a subsequent fabrication process, such as mask fabrication 144 or wafer production using maskless lithography.

Figure 10:
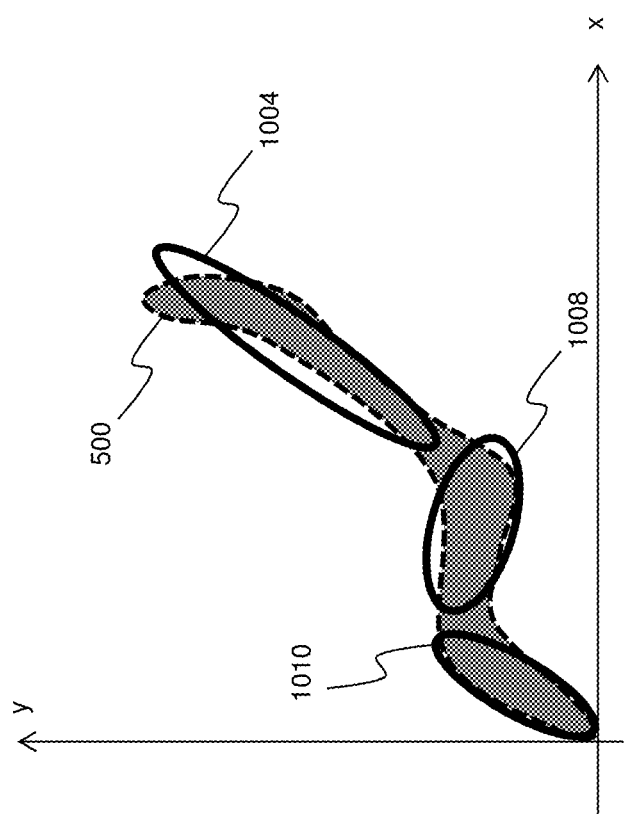

In the above discussion, a rectangle is used as a user-defined fabrication-friendly shape. Other shapes, such as an ellipse, can similarly be used. As illustrated in FIG. 10, in an embodiment, the pattern 500 is approximated by three ellipses 1004, 1008, and 1010 produced by the method 400. In another embodiment, a mixture of more than one user-defined fabrication-friendly shape can be used. For example, the pattern 500 can be approximated by a mixture of rectangles and ellipses.

Although not intended to be limiting, the present disclosure provides many benefits. For example, compared with the traditional Manhattan conversion method (FIG. 2), embodiments of the present disclosure may produce approximation patterns with much less jogs and segments, which reduce e-beam shot counts during mask fabrication and speed up product development. Some embodiments of the present disclosure can be used to implement model-based process-aware assist features. Furthermore, some embodiments of the present disclosure may utilize availability of parallel computing architecture.

Further, the methods 400 and 600 of the illustrated embodiment are designed to be executed on any computing architecture, such as the mask design system 180 described in association with FIG. 3. For example, the methods 400 and 600 may be executed on a single computer, local area networks, client-server networks, wide area networks, internets, hand-held and other portable and wireless devices and networks. Such architecture can take the form of an entirely hardware embodiment, an entirely software embodiment, or an embodiment containing both hardware and software elements. Hardware generally includes at least processor-capable platforms, such as client-machines (also known as personal computers or servers), and hand-held processing devices (such as smart phones, personal digital assistants (PDAs), or personal computing devices (PCDs), for example. Hardware can include any physical device that is capable of storing machine-readable instructions, such as memory or other data storage devices. Other forms of hardware include hardware sub-systems, including transfer devices such as modems, modem cards, ports, and port cards, for example. Software generally includes any machine code stored in any memory medium, such as RAM or ROM, and machine code stored on other devices (such as floppy disks, flash memory, or a CDROM, for example). Software can include source or object code, for example. In addition, software encompasses any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

In one exemplary aspect, the present disclosure is directed to a method of transforming an integrated circuit (IC) pattern, wherein the IC pattern is in a shape that is not one of a plurality of user-defined shapes. The method includes, using a computer, deriving an approximation IC pattern approximating the IC pattern, wherein the approximation IC pattern is in a shape that is one of the plurality of user-defined shapes. The method further includes calculating a pattern approximation error between the IC pattern and the approximation IC pattern. Upon a condition in which the pattern approximation error is greater than a user-defined threshold, the method further includes splitting the IC pattern into a plurality of subparts and recursively transforming each of the plurality of subparts.

In another exemplary aspect, the present disclosure is directed to a method of converting an IC mask pattern that is not a rectangular shape into at least one rectangle for mask fabrication. The method includes, using a computer, determining a rectangle approximating the IC mask pattern, wherein the rectangle and the IC mask pattern share a center of mass. The method further includes calculating a pattern approximation error between the rectangle and the IC mask pattern. When the pattern approximation error is less than a user-defined threshold, the method further includes accepting the rectangle as a replacement of the IC mask pattern in subsequent mask fabrication. Otherwise, the method further includes splitting the IC mask pattern into two subparts and recursively converting each of the two subparts that is not already a rectangular shape into at least one rectangle.

In another exemplary aspect, the present disclosure is directed to an integrated circuit (IC) design method. The method includes receiving an integrated circuit (IC) design layout, wherein the IC design layout has a first pattern that is not in a rectangular shape, and using a computer, determining a rectangle approximating the first pattern. The method further includes calculating a deviation between the first pattern and the rectangle. Upon a condition in which the deviation is less than a user-defined threshold, the method further includes replacing the first pattern with the rectangle in the IC design layout. Otherwise, the method further includes splitting the first pattern into a plurality of subparts, and for each of the plurality of subparts, recursively performing the steps of determining, calculating, conditionally replacing, and conditionally splitting.

In another exemplary aspect, the present disclosure is directed to a computer system that includes a processor and a memory comprising a set of computer readable instructions that when executed by the processor, causes the system to: derive an approximation pattern for an IC mask pattern having a freeform shape, wherein the approximation pattern is in a shape that is one of a plurality of user-defined mask fabrication-friendly shapes; calculate a pattern approximation error between the IC mask pattern and the approximation pattern; if the pattern approximation error is less than a user-defined threshold, accept the approximation pattern for subsequent mask fabrication, otherwise, split the IC mask pattern into a plurality of subparts and recursively derive an acceptable approximation pattern for each of the plurality of subparts.

The foregoing outlines features of several embodiments so that those having ordinary skill in the art may better understand the aspects of the present disclosure. Those having ordinary skill in the art should appreciate that they may readily use the present disclosure as a basis for designing or modifying other processes and structures for carrying out the same purposes and/or achieving the same advantages of the embodiments introduced herein. Those having ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of transforming a first integrated circuit (IC) pattern, wherein the first IC pattern includes a shape that is not one of a plurality of user-defined shapes, the method comprising the steps of:
   using a computer, deriving a second IC pattern approximating the first IC pattern, wherein the second IC pattern includes a shape that is one of the plurality of user-defined shapes;
   calculating a pattern approximation error between the first IC pattern and the second IC pattern; and
   upon a condition in which the pattern approximation error is greater than a user-defined threshold, performing the steps of:
      splitting the first IC pattern into a plurality of sub-patterns; and
      recursively transforming each of the plurality of sub-patterns.

2. The method of claim 1, wherein the first IC pattern includes a plurality of sub-patterns and a plurality of second IC sub-patterns have been derived respectively for the plurality of sub-patterns, further comprising:
   connecting the plurality of second IC sub-patterns.

3. The method of claim 1, further comprising, when the pattern approximation error is equal to or less than the user-defined threshold:
   outputting the second IC pattern in a computer-readable format.

4. The method of claim 1, wherein the plurality of user-defined shapes includes a rectangle.

5. The method of claim 1, wherein the plurality of user-defined shapes includes an ellipse.

6. The method of claim 1, wherein the second IC pattern has about the same area as the first IC pattern.

7. The method of claim 1, wherein the calculating the pattern approximation error includes:
   determining a center of mass of the first IC pattern; and
   upon a condition in which the center of mass is outside of the first IC pattern, assigning a value to the pattern approximation error, wherein the value is greater than the user-defined threshold.

8. The method of claim 1, further comprising:
   using a computer, determining a center of mass of the first IC pattern; and
   upon a condition in which the center of mass is outside of the first IC pattern, performing the steps of:
   separating the first IC pattern into a plurality of first IC pattern subsets before the deriving the second IC pattern, wherein the steps of calculating, deriving, and performing are performed on each of the first IC pattern subsets.

9. The method of claim 1, wherein the deriving the second IC pattern includes:
   mapping the first IC pattern to a number (N) of pixels, wherein each of the N pixels has an x-coordinate and an y-coordinate, and is represented by $(x_i, y_i)$ where $i \in [1, N]$;
   calculating an area, $a$, of the first IC pattern;
   calculating a geometric center $(x_w, y_w)$ of the N pixels, wherein $$x_w = \frac{1}{N} \sum_{1}^{N} x_i;$$

and $$y_w = \frac{1}{N} \sum_{1}^{N} y_i;$$

constructing a relative position matrix, M, wherein M is a N by 2 (N×2) array of real numbers and $i \in [1, N]$:

$$M = \begin{bmatrix} x_1 - x_w, y_1 - y_w \\ \vdots \\ x_i - x_w, y_i - y_w \\ \vdots \\ x_N - x_w, y_N - y_w \end{bmatrix} \in R^{N \times 2}$$

constructing a covariance matrix, A, $A = M^T M$;
calculating eigenvectors $u = [u_1, u_2]^T$ and $v = [v_1, v_2]^T$ and eigenvalues $\lambda_1$ and $\lambda_2$ by solving the following:

$$\begin{aligned} A &= M^T M \\ &= \begin{bmatrix} u_1 & v_1 \\ u_2 & v_2 \end{bmatrix} \begin{bmatrix} \lambda_1 & 0 \\ 0 & \lambda_2 \end{bmatrix} \begin{bmatrix} u_1 & v_1 \\ u_2 & v_2 \end{bmatrix}^{-1} \\ &= [u \ v] \begin{bmatrix} \lambda_1 & 0 \\ 0 & \lambda_2 \end{bmatrix} [u \ v]^{-1} \end{aligned}$$

; and
determining a rectangle that has a geometric center at $(x_w, y_w)$ and has a length L and a width W, wherein $$L = \sqrt{\left| \frac{a \lambda_1}{\lambda_2} \right|}$$

and $$W = \sqrt{\left| \frac{a \lambda_2}{\lambda_1} \right|}.$$

10. The method of claim 1, further comprising:
    fabricating a mask with the transformed IC pattern.

11. A method of converting an IC mask pattern that is not a rectangular shape into at least one rectangle for mask fabrication, comprising:
    using a computer, determining a rectangle approximating the IC mask pattern, wherein the rectangle and the IC mask pattern share a center of mass;
    calculating a pattern approximation error between the rectangle and the IC mask pattern;
    when the pattern approximation error is less than a user-defined threshold, accepting the rectangle as a replacement of the IC mask pattern in subsequent mask fabrication,
    otherwise,
       splitting the IC mask pattern into two subparts; and
       recursively converting each of the two subparts that is not already a rectangular shape into at least one rectangle.

12. The method of claim 11, wherein the splitting the IC mask pattern is both along a direction that is in parallel with a shorter side of the rectangle and across the center of mass.

13. The method of claim 11, further comprising:
outputting vertices of the at least one rectangle in a computer-readable format.

14. The method of claim 11, further comprising:
merging the at least one rectangle whereby the merged rectangles approximate the IC mask pattern.

15. The method of claim 11, wherein all sides of the at least one rectangle are oriented along one of two directions: a first direction and a second direction that is perpendicular to the first direction.

16. The method of claim 11, wherein all sides of the at least one rectangle are oriented along one of four directions: (1) a first direction, (2) a second direction that is perpendicular to the first direction, (3) a third direction that forms a 45 degree angle with the first direction, and (4) a fourth direction that is perpendicular to the third direction.

17. A method comprising the steps of:
receiving an integrated circuit (IC) design layout, the IC design layout having a first pattern that is not in a rectangular shape;
using a computer, determining a rectangle approximating the first pattern;
calculating a deviation between the first pattern and the rectangle; and
upon a condition in which the deviation is less than a user-defined threshold, replacing the first pattern with the rectangle in the IC design layout,
otherwise, performing the steps of:
splitting the first pattern into a plurality of subparts; and
for each of the plurality of subparts, recursively performing the steps of determining, calculating, conditionally replacing, and conditionally splitting.

18. The method of claim 17, further comprising, when multiple rectangles have thereby been produced for the first pattern:
concatenating the multiple rectangles in the IC design layout in such a way that they collectively approximate the first pattern.

19. The method of claim 17, further comprising:
manufacturing a mask with the IC design layout thus modified; and
exposing a wafer with the mask.

20. The method of claim 17, wherein the splitting step, when executed, produces two subparts.

* * * * *